(12) United States Patent
Komai

(10) Patent No.: US 8,458,537 B2
(45) Date of Patent: Jun. 4, 2013

(54) NONVOLATILE SEMICONDUCTOR MEMORY DEVICE

(75) Inventor: Hiromitsu Komai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 13/151,548

(22) Filed: Jun. 2, 2011

(65) Prior Publication Data
US 2011/0302469 A1 Dec. 8, 2011

(30) Foreign Application Priority Data
Jun. 2, 2010 (JP) .................................. 2010-127167

(51) Int. Cl.
*G06F 11/00* (2006.01)
*G11C 29/00* (2006.01)

(52) U.S. Cl.
USPC .......................... 714/718; 714/704; 365/200

(58) Field of Classification Search
USPC .............. 714/718, 704, 719, 723, 763, 799, 714/805, 6.1, 6.13, 29, 42; 365/200, 201
See application file for complete search history.

(56) References Cited

U.S. PATENT DOCUMENTS

| 5,278,839 | A  | * | 1/1994 | Matsumoto et al. | 714/710 |
| 6,862,703 | B2 | * | 3/2005 | Oonk | 714/718 |
| 6,940,781 | B2 | * | 9/2005 | Seitoh | 365/230.06 |
| 7,423,904 | B2 |   | 9/2008 | Kojima et al. | |

FOREIGN PATENT DOCUMENTS

| JP | 2007-66386 | 3/2007 |
| JP | 2007-102942 | 4/2007 |
| JP | 2011-170927 | 9/2011 |

OTHER PUBLICATIONS

U.S. Appl. No. 12/884,721, filed Sep. 17, 2010, Masahiro Yoshihara, et al.

* cited by examiner

*Primary Examiner* — Christine Tu
(74) *Attorney, Agent, or Firm* — Oblon, Spivak, McClelland, Maier & Neustadt, L.L.P.

(57) ABSTRACT

According to one embodiment, a nonvolatile semiconductor memory device comprises a memory cell array, a write control circuit, a latch circuit, an address control circuit, a scan control circuit, and an address latch circuit. The write control circuit executes write and verify for each page of the memory cell array. The latch circuit holds data of the verify result. The address control circuit divides the page into zones and sequentially selects the address of each of the zones. The scan control circuit executes scan so as to count the number of fail bits in zone selected by the address control circuit and determine whether the number of fail bits is not more than the number of allowable bits. The address latch circuit holds the address of a no fail zone, out of the plurality of zones, in which the number of fail bits is 0.

20 Claims, 14 Drawing Sheets

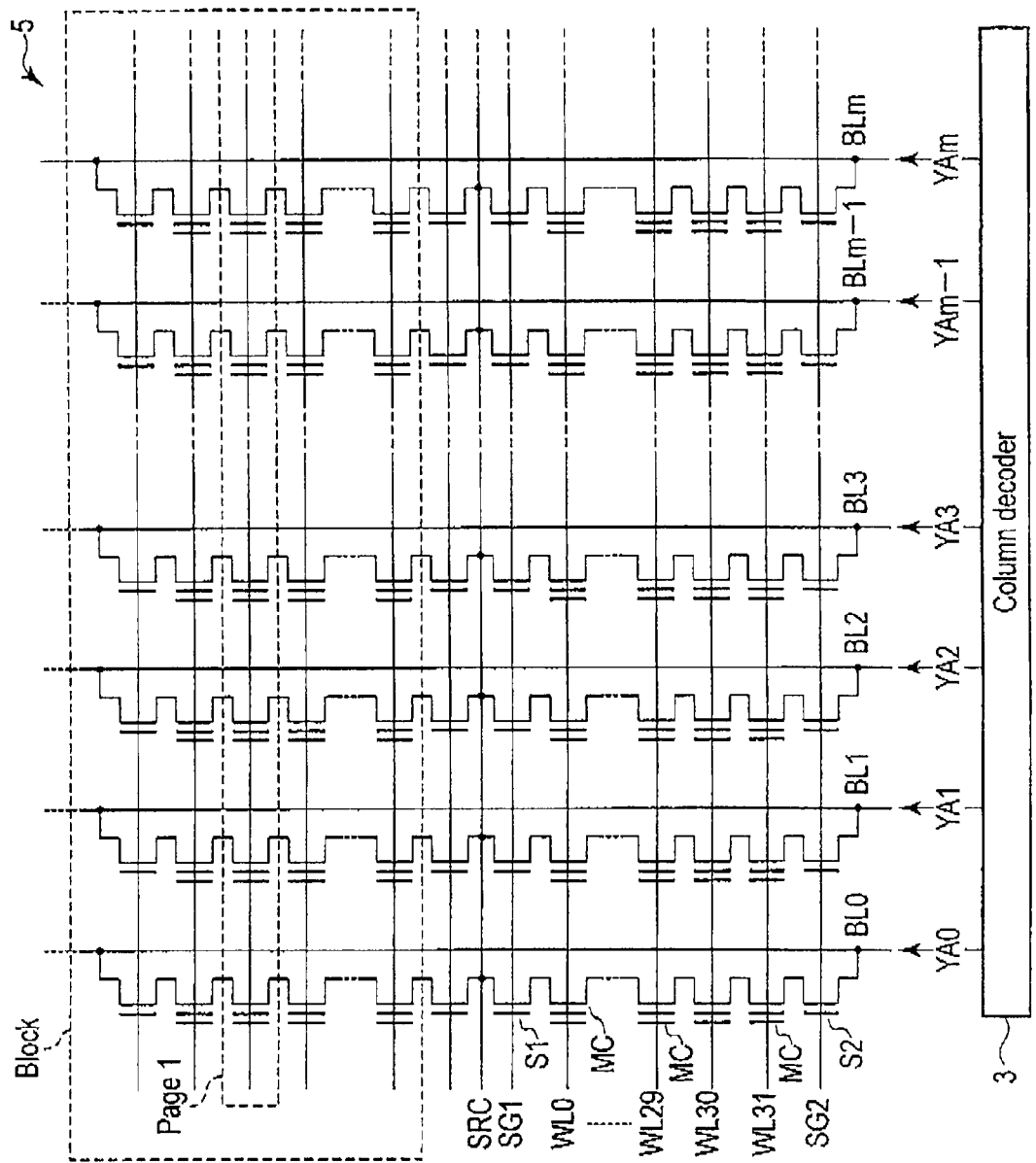
F I G. 2

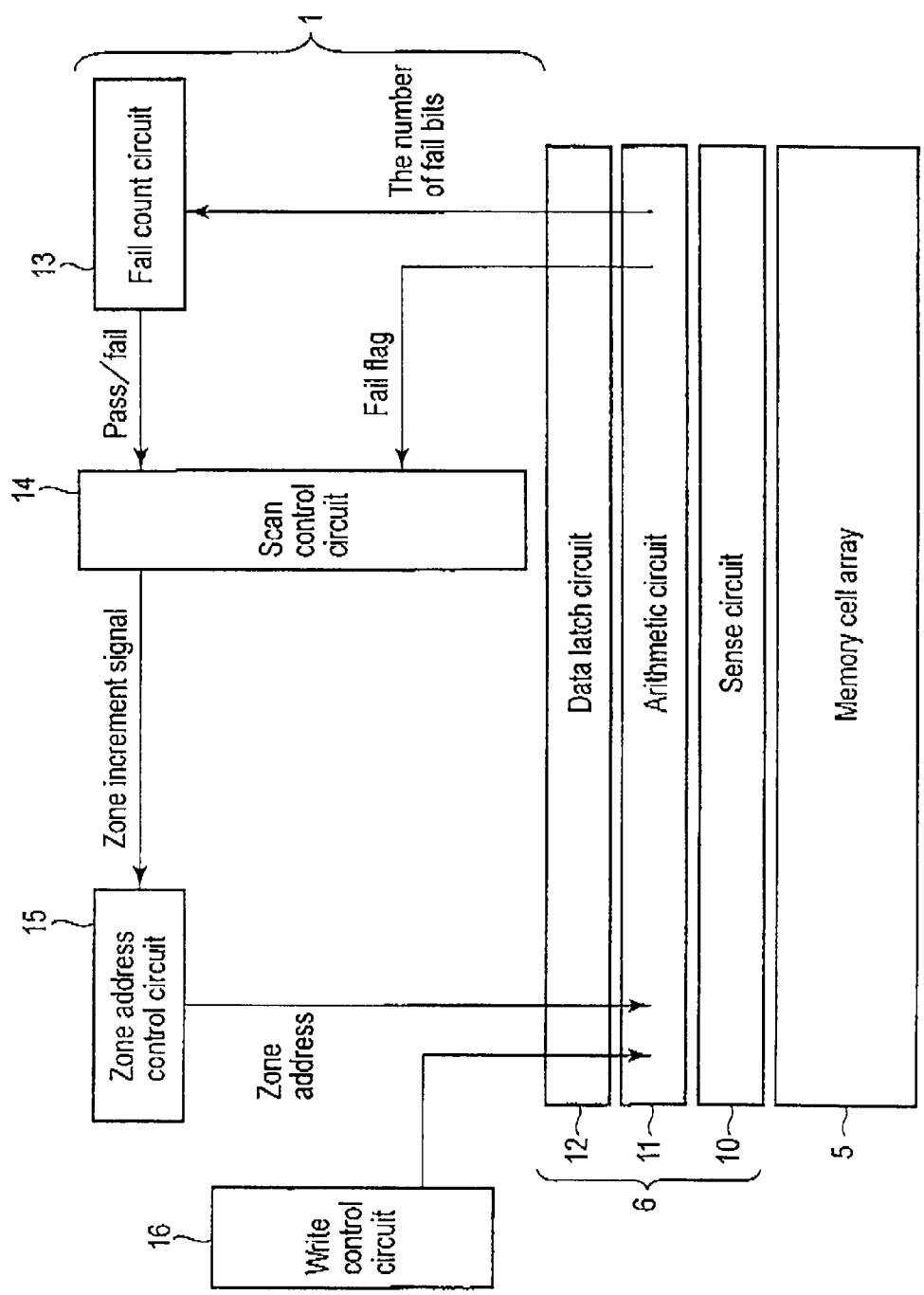
F I G. 4

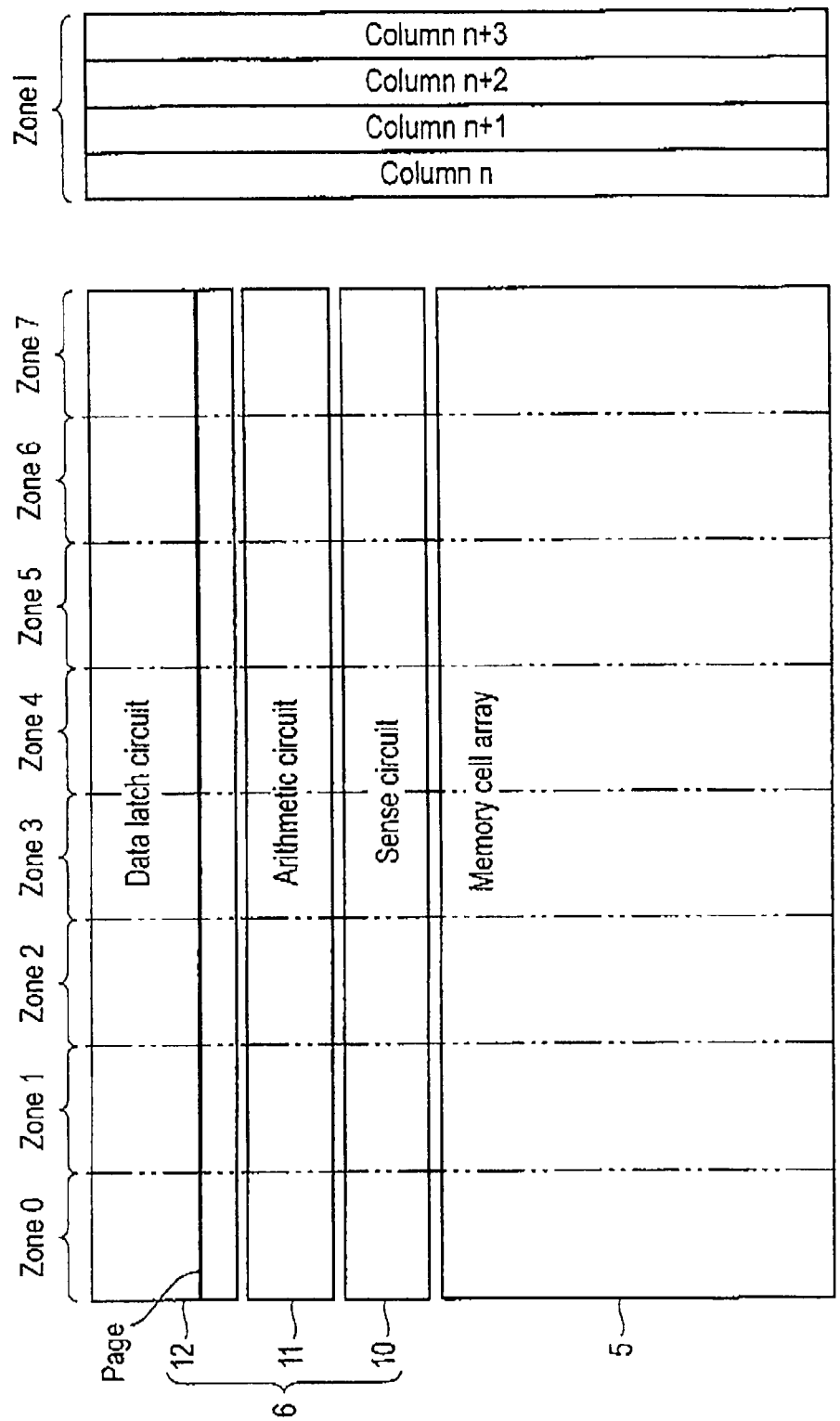
F I G. 5

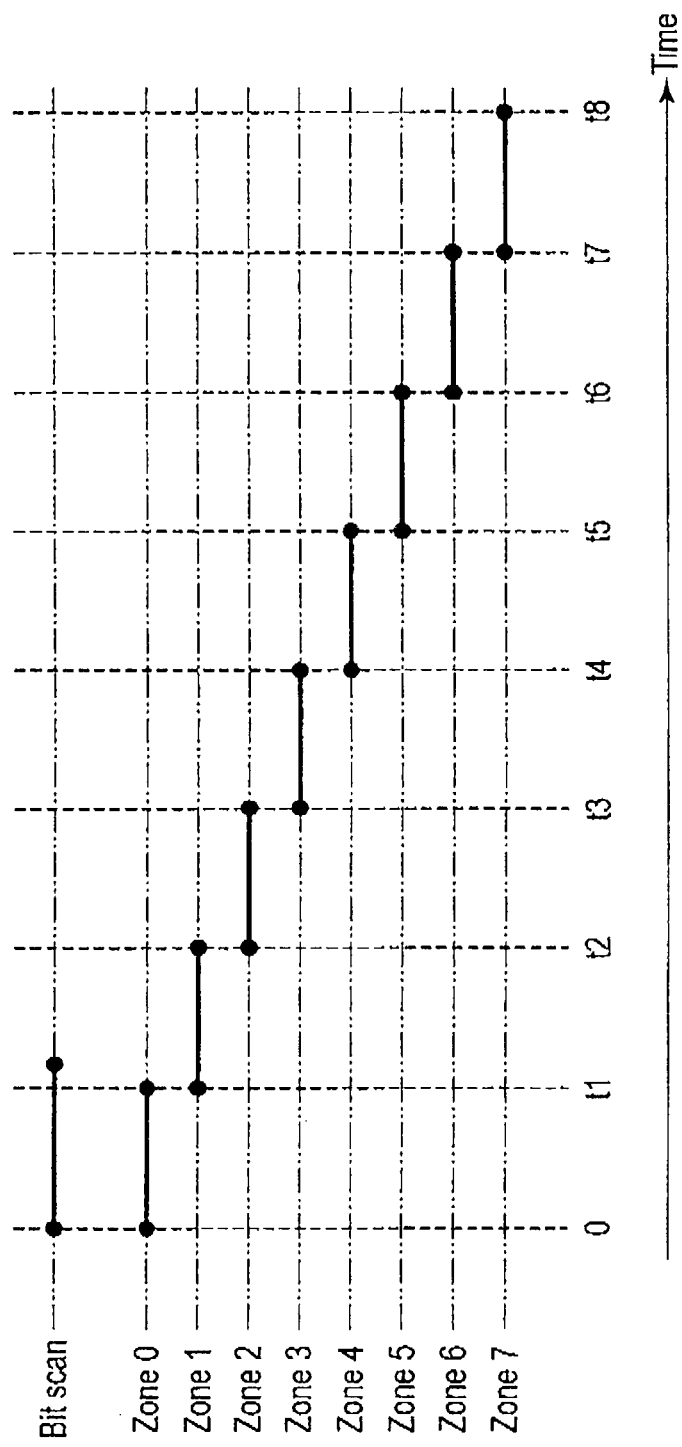
F I G. 8

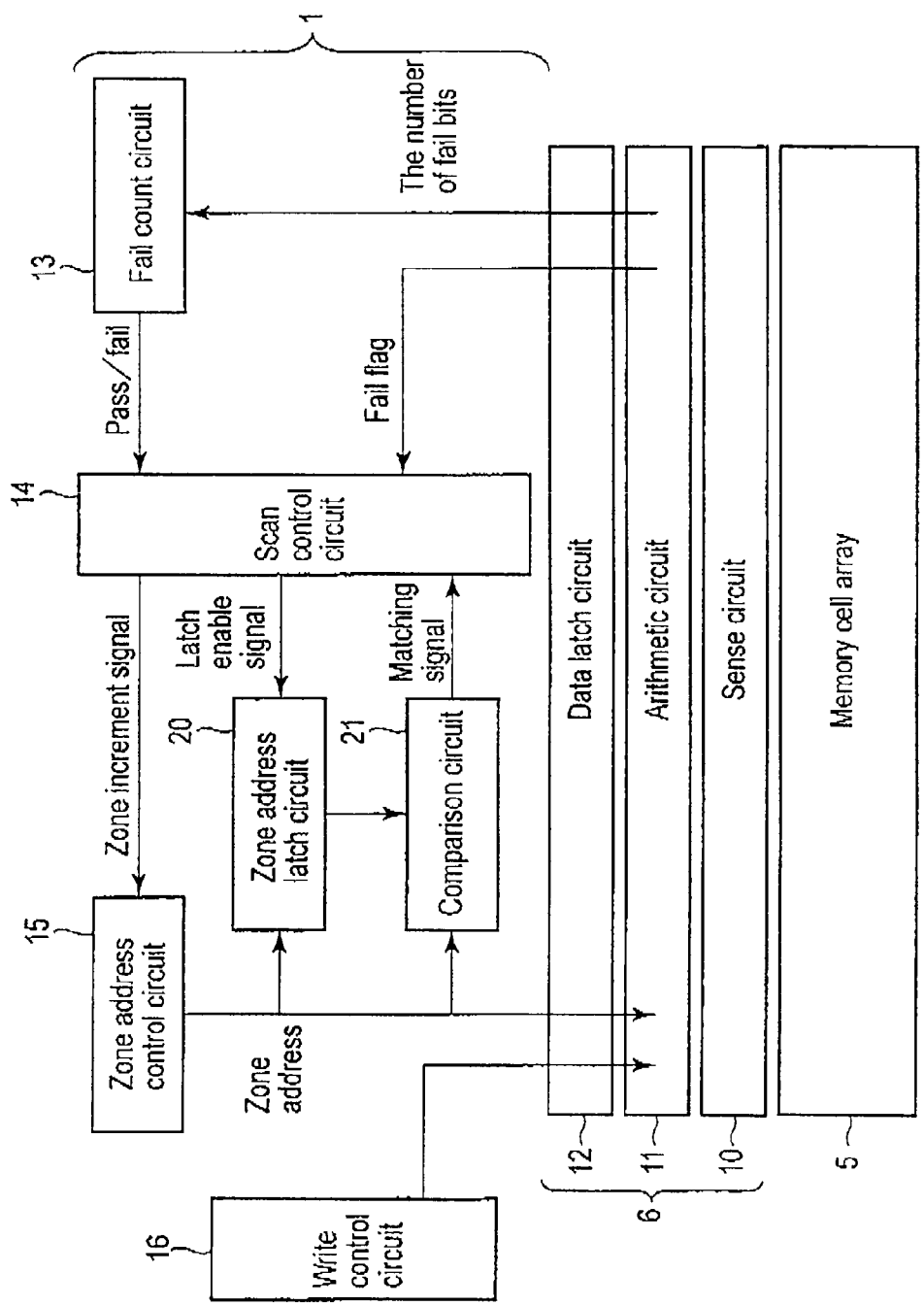
F I G. 9

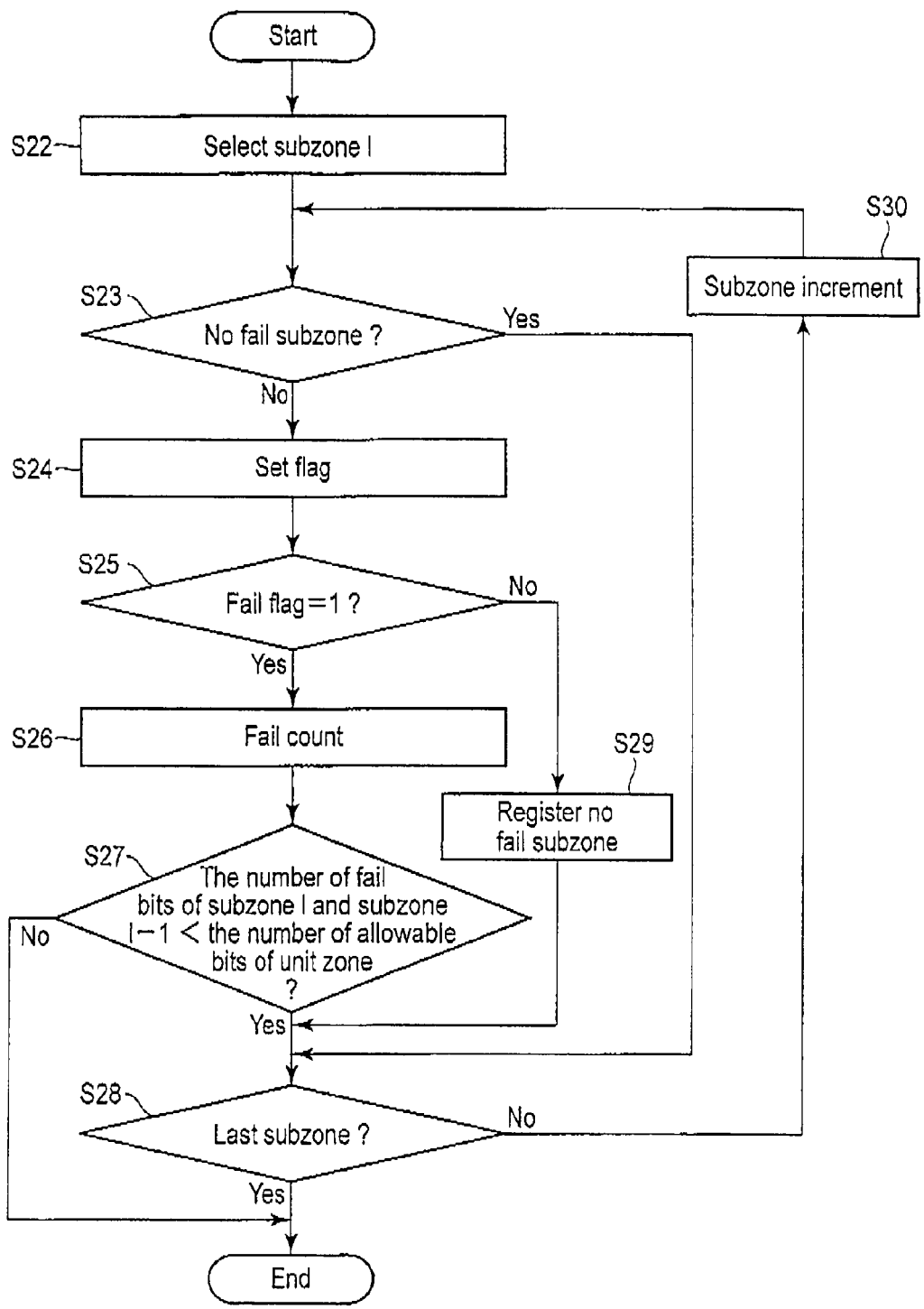
F I G. 14

NONVOLATILE SEMICONDUCTOR MEMORY DEVICE

CROSS-REFERENCE TO RELATED APPLICATIONS

This application is based upon and claims the benefit of priority from Japanese Patent Application No. 2010-127167, filed Jun. 2, 2010; the entire contents of which are incorporated herein by reference.

FIELD

Embodiments described herein relate generally to a nonvolatile semiconductor memory device and are applied to, for example, control of a write operation in a NAND flash memory.

BACKGROUND

In a nonvolatile semiconductor memory device such as a NAND flash memory, data is written for each page. In the NAND flash memory, however, it is difficult to correctly write data in all cells by a write operation at one time. The write operation of the NAND flash memory is divided into three processes: (1) write, (2) verify read (verify), and (3) search/count of cells that have not ended the write (fail bits).

Processes 1 to 3 are repeated until the number of fail bits has equaled or fallen below the number of allowable bits (the allowable the number of fail bits) in process 3, or the write count has reached the maximum. The fail bit search/count in process 3 is called a scan. A NAND flash memory chip normally has a plurality of kinds of scan operations corresponding to write characteristics such as accuracy and speed.

There is proposed, for example, a method (bit scan) of detecting an error for each bit, counting the number of fail bits, and determining whether the number of fail bits is less than or equal to the number of allowable bits. In this bit scan, an entire page is scanned at a time, and it is determined for each page whether the number of fail bits is less than or equal to the number of allowable bits.

Recently, the number of fail bits increases as the micropatterning and multilevel cell technologies advance, or the page length increases. This leads to a requirement to increase the number of allowable bits. In the above-described bit scan, however, since the scan operation is performed for an entire page, the increase in the number of allowable bits has a limit.

BRIEF DESCRIPTION OF THE DRAWINGS

FIG. 2 is a circuit diagram showing an example of a memory cell array in FIG. 1;

FIG. 4 is a block diagram showing the circuit arrangement of the flash memory related to the embodiment;

FIG. 5 is a block diagram showing the zones of the flash memory according to the embodiment;

FIG. 8 is a timing chart showing the timing of the zone bit scan of the flash memory related to the embodiment;

FIG. 9 is a block diagram showing the circuit arrangement of the flash memory according to the embodiment;

FIG. 14 is a flowchart of a modification of zone bit scan of the flash memory according to the embodiment.

DETAILED DESCRIPTION

Figure 1:
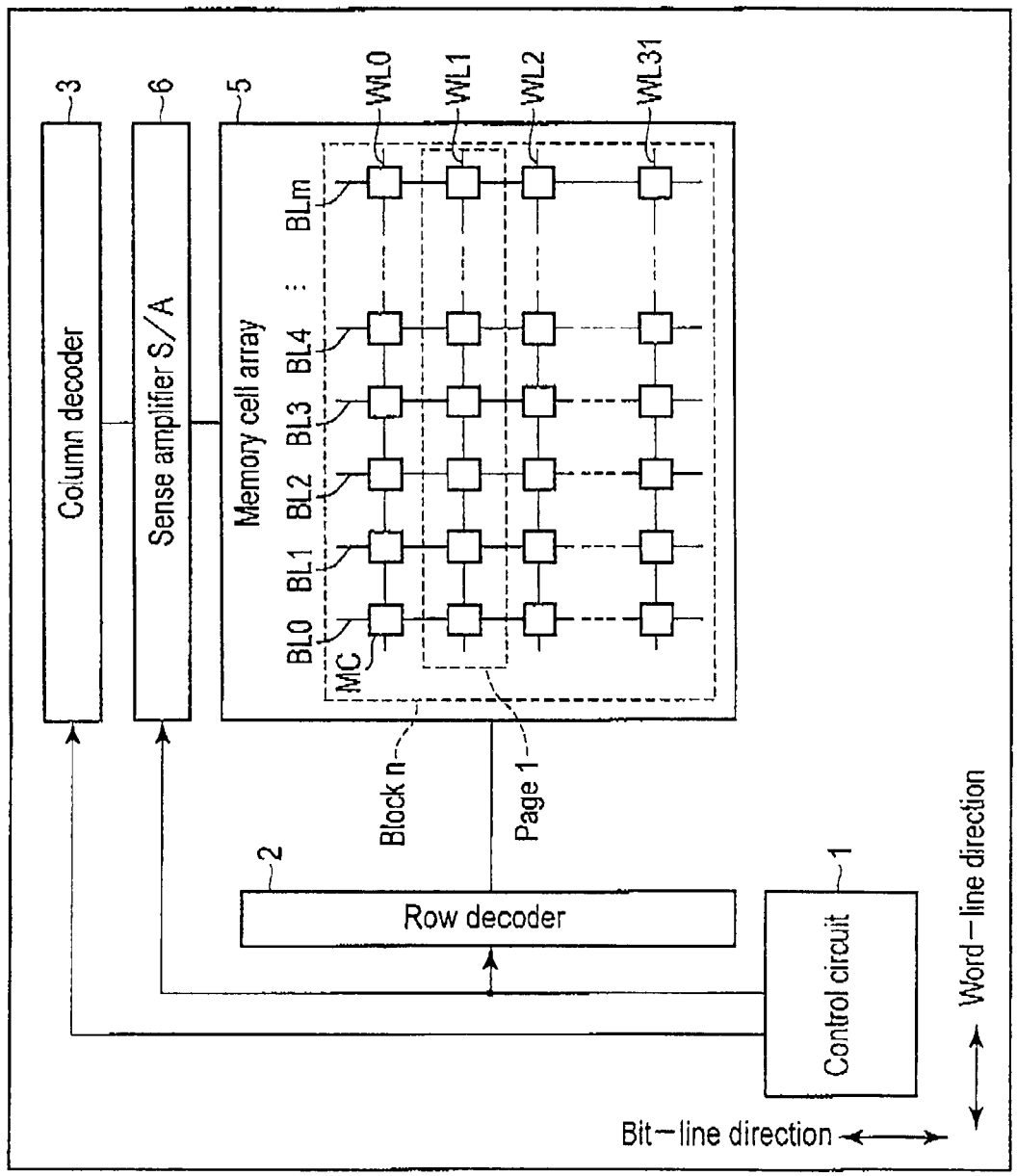
FIG. 1 is a block diagram showing an example of the overall arrangement of a flash memory according to the embodiment.

In general, according to one embodiment, a nonvolatile semiconductor memory device comprises: a memory cell array; a write control circuit; a latch circuit; an address control circuit; a scan control circuit; and an address latch circuit. The write control circuit executes write and verify for each page of the memory cell array. The latch circuit holds data of the verify result. The address control circuit divides the page into zones and sequentially selects the address of each of the zones. The scan control circuit executes scan so as to count the number of fail bits in zone selected by the address control circuit and determine whether the number of fail bits is not more than the number of allowable bits. The address latch circuit holds the address of a no fail zone, out of the plurality of zones, in which the number of fail bits is 0.

The embodiment will now be described with reference to the accompanying drawing. The same reference numbers denote the same parts throughout the drawing. Note that in this embodiment, a NAND flash memory will be exemplified in particular as a nonvolatile semiconductor memory device. However, the embodiment is not limited to this. That is, the embodiment is applicable to any nonvolatile semiconductor memory device that executes a scan operation.

[Example of Overall Arrangement]

An example of the overall arrangement of a flash memory according to the embodiment will be described below with reference to FIGS. 1 and 2.

FIG. 1 is a block diagram of the flash memory according to the embodiment. As shown in FIG. 1, the nonvolatile semiconductor memory device comprises a control circuit 1, a row decoder 2, a column decoder 3, a memory cell array 5, and a sense amplifier S/A 6.

The control circuit 1 is configured to generate voltages to be supplied to the gate electrodes of memory cells or word lines in the write, erase, or read mode and also control the row decoder 2, the column decoder 3, and the sense amplifier S/A in accordance with an externally supplied address.

The row decoder 2 is configured to select word lines WL0 to WL31 under the control of the control circuit 1. Note that the number of word lines WL is assumed to be 32 in this example. However, the number of word lines WL is changeable.

The column decoder 3 is configured to select bit lines BL0 to BLm via the sense amplifier S/A 6 under the control of the control circuit 1.

The memory cell array 5 has a plurality of blocks. FIG. 1 particularly illustrates a block n. The block n comprises word lines WL0 to WL31, bit lines BL0 to BLm, and a plurality of memory cells MC arranged in a matrix.

The sense amplifier S/A 6 is configured to amplify data read out from the memory cells MC to bit lines BL0 to BLm for each page under the control of the column decoder 3. Note that the sense amplifier S/A 6 may be integrated with the column decoder 3.

FIG. 2 shows the circuit arrangement of the memory cell array 5 and the column decoder 3 shown in FIG. 1. Referring to FIG. 2, the memory cell array 5 has a plurality of blocks, as indicated by the broken line. Each block is formed from a plurality of NAND cells, and data is erased for each block.

One NAND cell includes, for example, 32 memory cells MC whose channels are connected in series, a first selection transistor S1, and a second selection transistor S2. The first selection transistor S1 is connected to a source line SRC. The second selection transistor S2 is connected to bit line BL0. The control gates of the memory cells MC arranged on each row are commonly connected to word lines WL0 to WL31. The first selection transistors S1 are commonly connected to a first selection gate SG1. The second selection transistors S2 are commonly connected to a second selection gate SG2.

In the read operation or the write operation, bit lines of one page are selected in accordance with address signals (YA1, YA2, ..., YAm) designated by the column decoder 3.

[Write Operation]

The write operation of the flash memory according to the embodiment will be described below with reference to FIG. 3.

Figure 3:
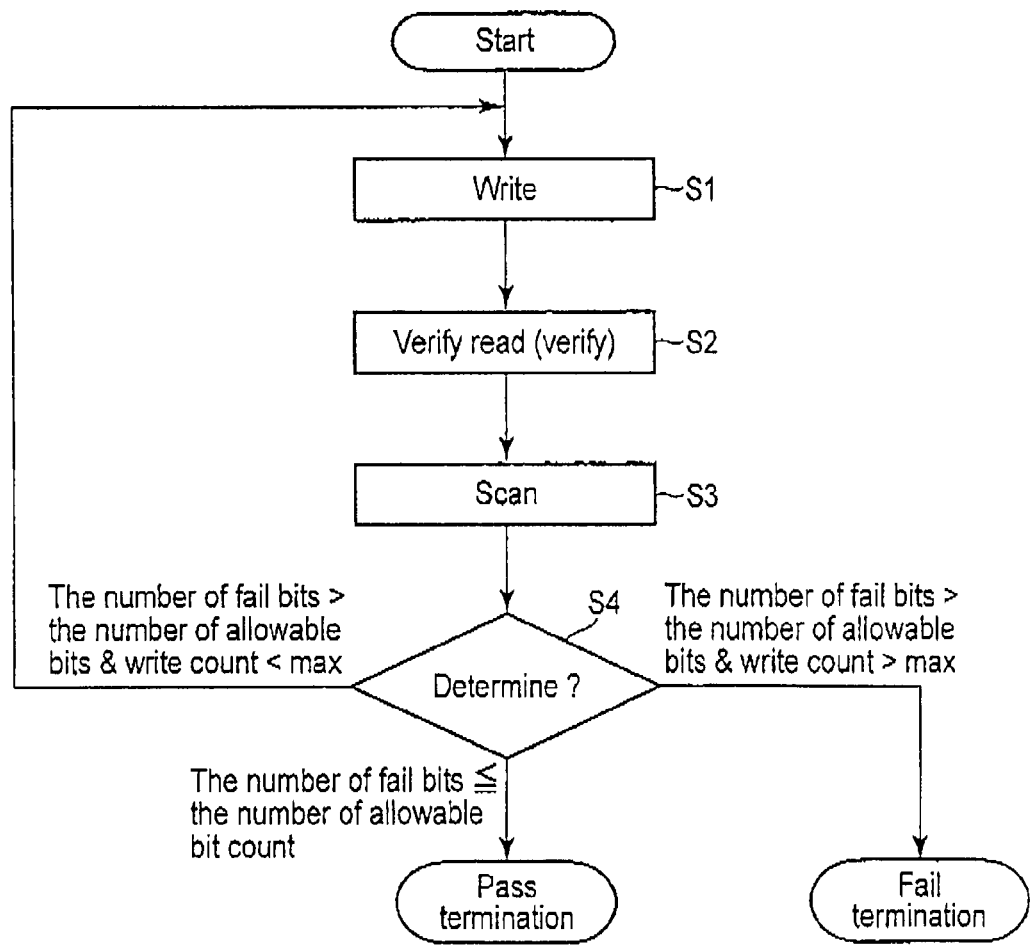
FIG. 3 is a flowchart of the write operation of the flash memory according to the embodiment.

FIG. 3 is a flowchart illustrating the write operation of the flash memory according to the embodiment.

As shown in FIG. 3, the write operation mainly includes three processes: (1) write, (2) verify read (verify), and (3) fail bit search/count (scan).

In step S1, the write is executed. More specifically, the control circuit 1 controls the row decoder 2 and the column decoder 3 to select a target cell and apply a write voltage to the selected target cell. At this time, the write is performed for each page of the memory cell array 5.

In step S2, the verify is executed. More specifically, the control circuit 1 controls the row decoder 2 and the column decoder 3 to select a target cell and apply a verify voltage to the selected target cell. At this time, the verify is performed for each page of the memory cell array 5. The data verified in the memory cell array 5 is held by a data latch circuit and a sense circuit (to be described later) of the sense amplifier S/A 6.

In step S3, the scan is executed based on the data held by the sense amplifier S/A 6. The scan will be described later.

In step S4, the scan result is determined. More specifically, if the number of fail bits is less than or equal to the number of allowable bits as the result of scan, the write operation ends with a write success (pass).

Conversely, if the number of fail bits is larger than the number of allowable bits as the result of scan, the write count is further determined. More specifically, if the number of fail bits is larger than the number of allowable bits, and the write count has not reached the maximum write count, the write is performed again in step S1. If the number of fail bits is larger than the number of allowable bits, and the write count has reached the maximum write count, the write operation ends with a write failure (fail).

This embodiment is mainly directed to the scan in step S3. The scan according to the embodiment will be described below.

[Zone Bit Scan]

Regarding scan in the conventional NAND flash memory, bit scan has been proposed, which counts the number of fail bits in each page and determines whether the number of fail bits is less than or equal to the number of allowable bits. In this embodiment, a method (zone bit scan) will be proposed instead, which divides a page into predetermined zones, counts the number of fail bits in each zone, and determines whether the number of fail bits is less than or equal to the number of allowable bits. The zone bit scan will be explained below with reference to FIGS. 4, 5, 6, 7, and 8.

FIG. 4 is a block diagram showing the circuit arrangement of the flash memory that executes zone bit scan related to the embodiment. More specifically, FIG. 4 illustrates the circuit arrangement of the control circuit 1, the memory cell array 5, and the sense amplifier S/A 6 shown in FIG. 1. Note that the row decoder 2 and the column decoder 3 in FIG. 1 are not illustrated. FIG. 5 shows zones in the memory cell array 5 and the sense amplifier S/A 6.

As shown in FIG. 4, the flash memory comprises the memory cell array 5, the sense amplifier S/A 6, and the control circuit 1.

The sense amplifier S/A 6 comprises a sense circuit 10, an arithmetic circuit 11, and a data latch circuit 12.

The sense circuit 10 and the data latch circuit 12 hold data as the result of verify read (verify) from the memory cell array 5.

The arithmetic circuit 11 calculates the number of fail bits from the data held by the sense circuit 10 and the data latch circuit 12, and transfers the number of fail bits to a fail count circuit 13 to be described later. The arithmetic circuit 11 also transfers a fail flag concerning fail information to a scan control circuit 14 to be described later.

As shown in FIG. 5, zone bit scan divides a page into predetermined regions each of which is defined as one zone. FIG. 5 shows an example in which a page is divided into eight zones (for example, zones 0 to 7). One zone (zone 1) has a plurality of columns (for example, columns n to n+3). In the zone bit scan, the scan operation is performed for each zone, although the write operation or read operation is performed for the entire page at a time. That is, in the zone bit scan, the arithmetic circuit 11 transfers only the number of fail bits of a selected zone to the fail count circuit 13. The scan control circuit 14 to be described later then determines whether the number of fail bits is less than or equal to the number of allowable bits.

The control circuit 1 comprises the fail count circuit 13, the scan control circuit 14, a zone address control circuit 15, and a write control circuit 16.

The fail count circuit 13 accumulates the number of fail bits transferred from the arithmetic circuit 11.

The scan control circuit 14 executes the scan operation. More specifically, the scan control circuit 14 counts the number of fail bits accumulated in the fail count circuit 13 for each zone in accordance with the fail flag transferred from the arithmetic circuit 11, and determines whether the number of fail bits is less than or equal to the number of allowable bits (whether fail or pass). When the scan of the selected zone has ended, the scan control circuit 14 outputs a zone increment signal to the zone address control circuit 15.

The zone address control circuit 15 sequentially selects a zone to be scanned. More specifically, the zone address control circuit 15 selects the initial zone at the start of scan, or selects the zone to be scanned next upon receiving the zone increment signal from the scan control circuit 14.

The write control circuit 16 executes write and verify for each page of the memory cell array 5 via the row decoder and the column decoder (not shown).

Figure 6:
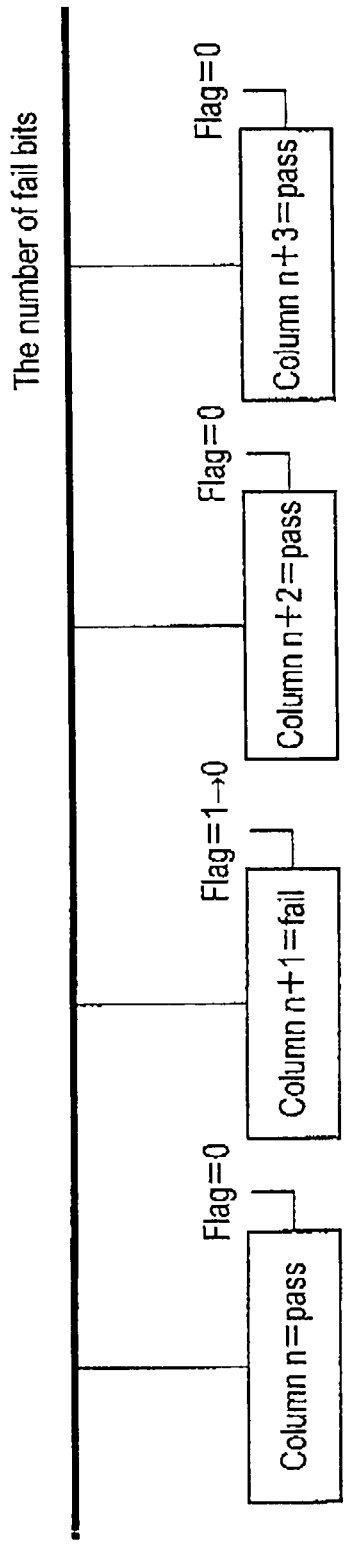
FIG. 6 is a view showing fail information in a zone of the flash memory according to the embodiment.

FIG. 6 shows flags serving as fail information in one zone of the arithmetic circuit 11. As shown in FIG. 6, when scan starts, a flag serving as fail information of each column is set. If a column indicates pass, the flag is "0". If a column indicates fail, the flag is "1". More specifically, referring to FIG.

6, columns n, n+2, and n+3 indicating pass, the flags are "0". Column n+1 indicating fail, the flag is "1"

The flags of all columns (columns n to n+3) in the zone are ORed to set a fail flag. That is, if at least one of the flags of columns n to n+3 is "1", the fail flag of that zone is "1". When the fail flag is "1", the scan control circuit 14 determines that a fail exists in the zone, and starts searching for and counting fail bits.

As shown in FIG. 6, the zone bit scan searches for a column whose flag is "1" in each zone. The number of fail bits is transferred from the column with the flag "1" to the fail count circuit 13. After transfer of the number of fail bits, the column is given the flag "0" and excluded from the next search. This operation is repeated to accumulate the number of fail bits in the fail count circuit 13 until the number of fail bits exceeds the number of allowable bits, or the flags of all columns change to "0" (the fail flag changes to "0"). Note that changing the flag of a column to "0" means that the number of fail bits of the column is transferred and counted, not that the fail is actually eliminated.

In the zone bit scan, control is performed such that setting the flag of a column to "1" is done only in the selected zone, and the flag of a column in an unselected zone is set to "0". This allows only fail bits in the selected zone to be counted.

Figure 7:
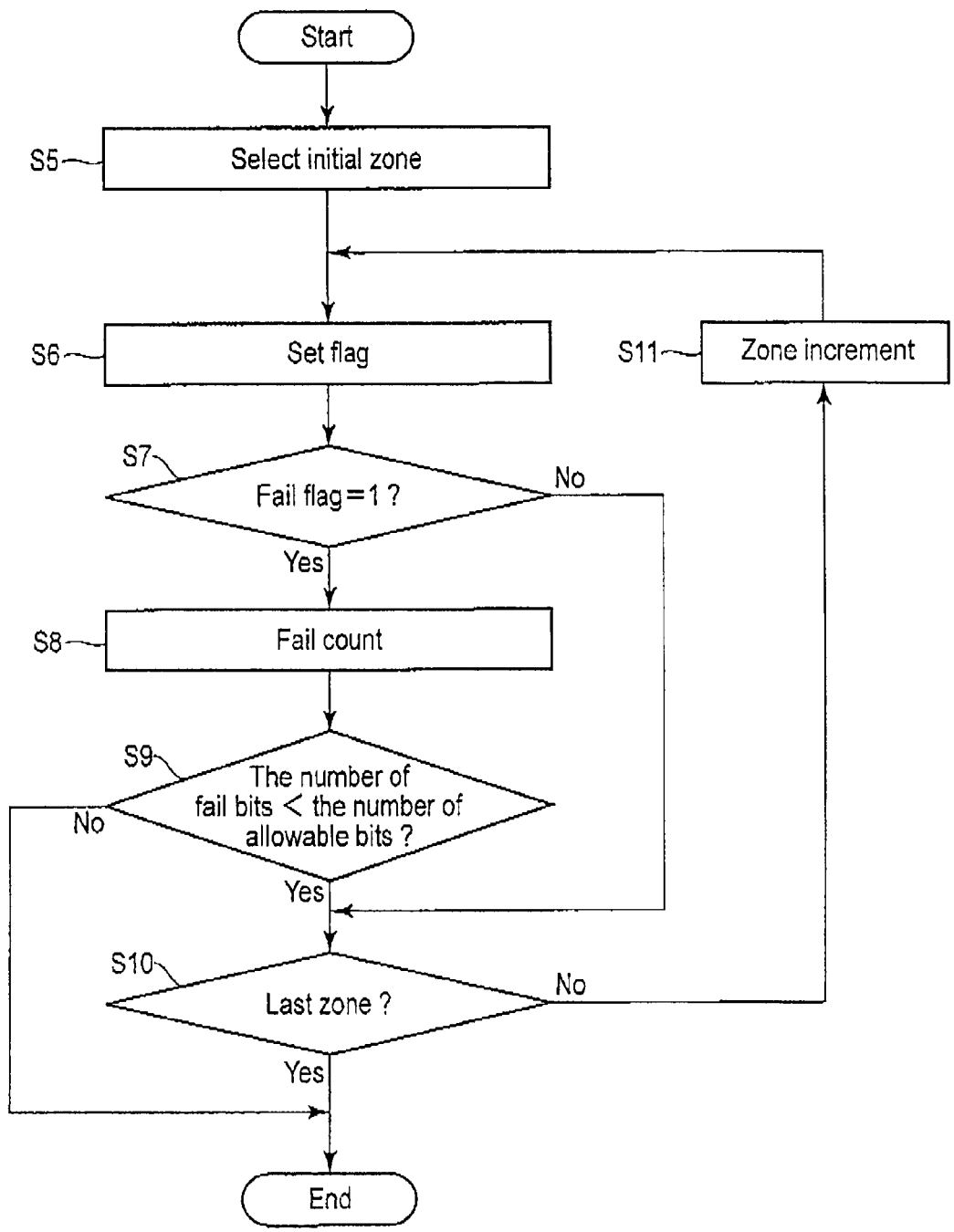
FIG. 7 is a flowchart of zone bit scan of the flash memory related to the embodiment.

FIG. 7 is a flowchart of zone bit scan related to the embodiment. Note that the zone bit scan is the process corresponding to step S3 in FIG. 3. That is, the scan assumes that the write has been executed (step S1), the verify has been executed (step S2), and the data latch circuit 12 and the sense circuit 10 are holding verify data from the memory cell array 5.

As shown in FIG. 7, in step S5, the initial zone to be scanned is selected first.

In step S6, the flags serving as fail information are set. At this time, control is performed to set the flag "1" only for a column in the selected zone and the flag "0" for a column in an unselected zone. The flags in the selected zone are thus ORed to set the fail flag.

In step S7, it is determined whether the fail flag is "1" (a fail exists in the selected zone).

If the fail flag is not "1" (the fail flag is "0") in step S7, it is determined in step S10 whether the selected zone is the last zone.

Conversely, if the fail flag is "1" in step S7, the number of fail bits in the selected zone are counted in step S8, and it is determined in step S9 whether the number of fail bits is less than or equal to the number of allowable bits.

If the number of fail bits is greater than the number of allowable bits in step S9 (if the number of fail bits exceeds the number of allowable bits), the scan operation ends.

Conversely, if the number of fail bits is less than or equal to the number of allowable bits in step S9, it is determined in step S10 whether the selected zone is the last zone.

If the selected zone is not the last zone in step S10, the zone increment signal is output in step S11 to select the next zone to be scanned. After that, in step S6, the flags serving as fail information are set.

Conversely, if the selected zone is the last zone in step S10, the scan operation ends.

As described above, the zone bit scan divides a page into predetermined zones and executes scan in each zone, unlike bit scan that executes scan in each page. In the zone bit scan, since the number of fail bits are counted in each zone, it is possible to make the number of allowable bits for an entire page larger than in bit scan. However, as shown in FIG. 8, scan one zone takes almost the same time as that in the bit scan that scans the entire page. For this reason, the time taken by the zone bit scan is equal to bit scan time×the number of zones (t1×8=t8).

In the zone bit scan, if the number of fail bits in the selected zone is less than or equal to the number of allowable bits, the selected zone is shifted by one so as to similarly count the number of fail bits in the next selected zone. The scan ends when the number of fail bits in the selected zone has exceeded the number of allowable bits, or the selected zone has reached the last zone. After that, the write and verify are executed again. As the write count increases, the number of fail bits decreases, and zones without any fail (no fail zones) come out. In the normal method, all zones are scanned, including zones without any fail. This takes extra time.

Recently, the number of fail bits increases as the micropatterning and multilevel cell technologies advance, and the page length increases. Since this creates the need for increasing the number of allowable bits, the zone bit scan acquires greater importance. The zone width of zone bit scan can be set for each chip of the flash memory. For a larger zone, the total scan time can shorten although the number of allowable bits cannot increase. Conversely, for a smaller zone, the number of allowable bits can increase although the scan time cannot shorten.

Embodiment

This embodiment proposes a scan operation aiming at time shortening in the zone bit scan where the number of allowable bits is increased. The zone bit scan according to this embodiment will be described below with reference to FIGS. 9, 10, and 11. Note that in the zone bit scan of the embodiment, a description of the same points as in the above-described zone bit scan will be omitted, and only different points will be described.

FIG. 9 is a block diagram showing the circuit arrangement of the flash memory that executes zone bit scan according to the embodiment. More specifically, FIG. 9 illustrates the circuit arrangement of the control circuit 1, the memory cell array 5, and the sense amplifier S/A 6 shown in FIG. 1. Note that the row decoder 2 and the column decoder 3 in FIG. 1 are not illustrated.

As shown in FIG. 9, the flash memory comprises the memory cell array 5, the sense amplifier S/A 6, and the control circuit 1.

The sense amplifier S/A 6 comprises the sense circuit 10, the arithmetic circuit 11, and the data latch circuit 12.

The sense circuit 10 and the data latch circuit 12 hold data verify-read (verified) from the memory cell array 5.

The arithmetic circuit 11 calculates the number of fail bits from the data held by the sense circuit 10 and the data latch circuit 12, and transfers the number of fail bits to the fail count circuit 13 to be described later. The arithmetic circuit 11 also transfers a fail flag concerning fail information to the scan control circuit 14 to be described later.

The control circuit 1 comprises the fail count circuit 13, the scan control circuit 14, the zone address control circuit 15, the write control circuit 16, a zone address latch circuit 20, and a comparison circuit 21.

The fail count circuit 13 accumulates the number of fail bits transferred from the arithmetic circuit 11.

The scan control circuit 14 executes the scan operation. More specifically, the scan control circuit 14 counts the number of fail bits accumulated in the fail count circuit 13 in accordance with the fail flag transferred from the arithmetic circuit 11, and determines whether the number of fail bits is less than or equal to the number of allowable bits (whether fail or pass). When the scan operation has ended, the scan control circuit 14 outputs the zone increment signal.

The zone address control circuit 15 sequentially selects a zone to be scanned. More specifically, the zone address control circuit 15 selects the initial zone at the start of scan, or selects the zone to be scanned next upon receiving the zone increment signal from the scan control circuit 14.

The write control circuit 16 executes write and verify for each page of the memory cell array 5 via the row decoder and the column decoder (not shown).

The flash memory according to this embodiment is different from the above-described flash memory in that the control circuit 1 comprises the zone address latch circuit 20 and the comparison circuit 21. The zone address latch circuit 20 and the comparison circuit 21 will be described below in detail.

If the fail flag of the selected zone transferred from the arithmetic circuit 11 at the start of scan is "0", the scan control circuit 14 determines that the selected zone is a no fail zone, and outputs a latch enable signal to the zone address latch circuit 20.

The zone address latch circuit 20 receives the latch enable signal from the scan control circuit 14, and holds the address of the selected zone that is the no fail zone. The held zone address is used in the subsequent scan. The zone address latch circuit 20 comprises (the number of zones—1) latches. This is because the scan is executed when at least one zone with the number of fail bits larger than the number of allowable bits exists, and the zone address latch circuit 20 can hold (number of zones—1) addresses at maximum.

The comparison circuit 21 compares the zone address held by the zone address latch circuit 20 with the currently selected zone address transferred from the zone address control circuit 15. The zone address held by the zone address latch circuit 20 is the address of the no fail zone held in the preceding scan. If the addresses match, the comparison circuit 21 outputs a matching signal to the scan control circuit 14. Upon receiving the matching signal, the scan control circuit 14 determines that the currently selected zone is a no fail zone. The scan control circuit 14 then outputs the zone address increment signal to the zone address control circuit 15 to skip the scan of the selected zone. Conversely, if the zone address held by the zone address latch circuit 20 does not match the currently selected zone address transferred from the zone address control circuit 15, the scan control circuit 14 executes scan of the selected zone.

Figure 10:
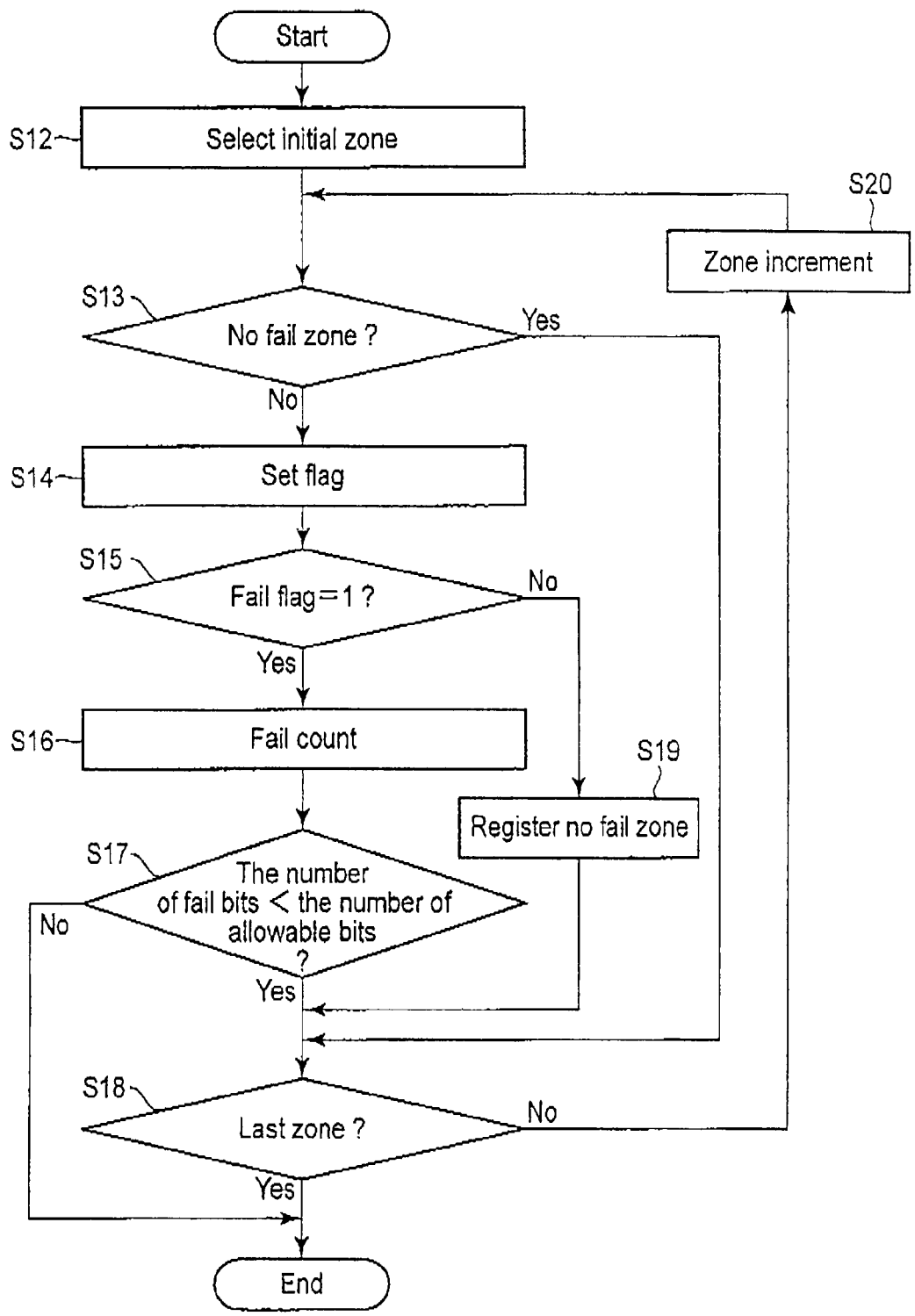
FIG. 10 is a flowchart of zone bit scan of the flash memory according to the embodiment.

FIG. 10 is a flowchart of zone bit scan according to the embodiment.

As shown in FIG. 10, in step S12, the initial zone to be scanned is selected first.

In step S13, it is determined whether the selected zone is a no fail zone. More specifically, the zone address held by the zone address latch circuit 20 is compared with the currently selected zone address to determine whether they match. The zone address held by the zone address latch circuit 20 is the zone address determined to be of a no fail zone in the scan of the preceding write operation.

If the selected zone is a no fail zone in step S13, it is determined in step S18 whether the selected zone is the last zone. That is, upon determining that the selected zone is a no fail zone, the scan operation is skipped from then on.

Conversely, if the selected zone is not a no fail zone in step S13, the flags serving as fail information are set in step S14. In step S15, it is determined whether the fail flag of the selected zone is "1" (a fail exists in the selected zone).

If the fail flag is not "1" (the fail flag is "0") in step S15, the selected zone is registered as a no fail zone in step S19. More specifically, the zone address latch circuit 20 holds the address of the selected zone that is a no fail zone. This address data is used in the scan of the succeeding write operation. After that, it is determined in step S18 whether the selected zone is the last zone.

Conversely, if the fail flag is "1" in step S15, fail bits in the selected zone are counted in step S16, and it is determined in step S17 whether the number of fail bits is less than or equal to the number of allowable bits.

If the number of fail bits is greater than the number of allowable bits in step S17 (if the number of fail bits exceeds the number of allowable bits), the scan operation ends.

Conversely, if the number of fail bits is less than or equal to the number of allowable bits in step S17, it is determined in step S18 whether the selected zone is the last zone.

If the selected zone is not the last zone in step S18, the zone increment signal is output in step S20 to select the next zone to be scanned. After that, it is determined in step S13 whether the selected zone is a no fail zone.

Conversely, if the selected zone is the last zone in step S18, the scan operation ends.

Note that when the scan (fail count) of the selected zone has ended, the fail flag of the selected zone appears to be "0". However, address registration for a no fail zone is done in the state before the fail count of step S16. For this reason, even when the fail flag appears to be "0" after the fail count, the address registration for a no fail zone is not performed.

[Effects]

Figure 11:
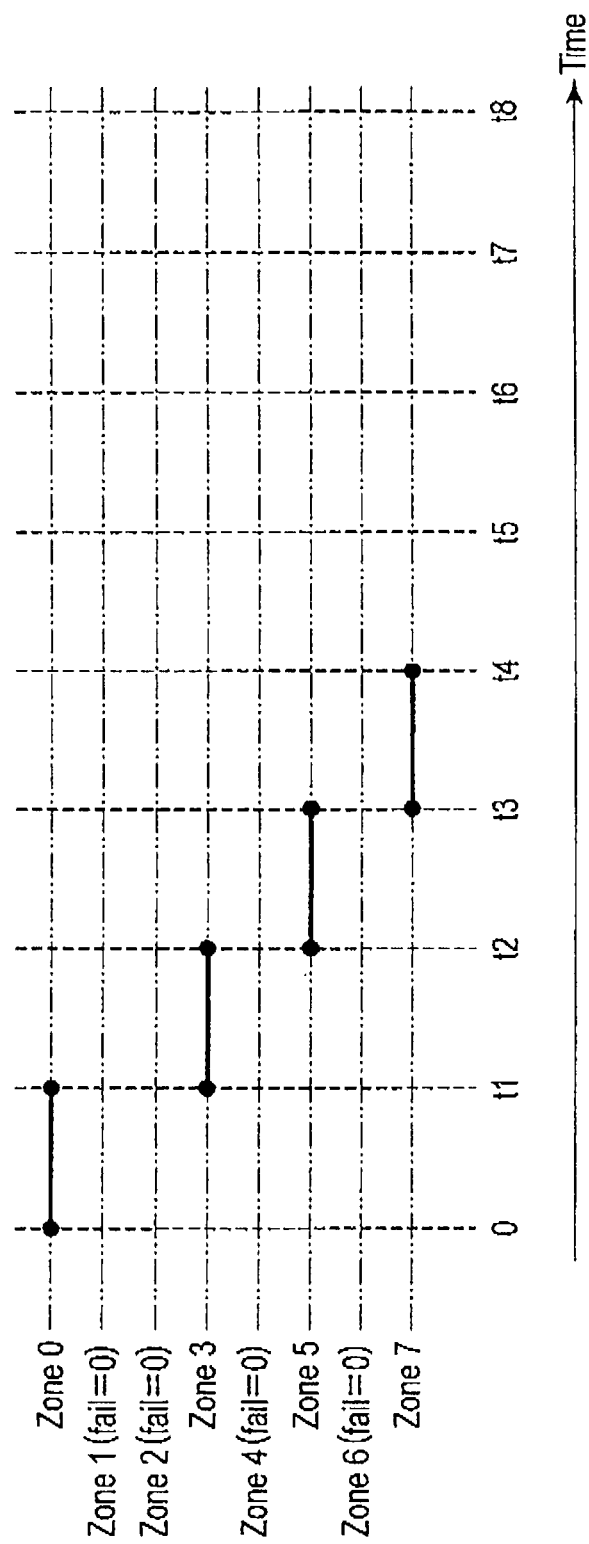
FIG. 11 is a timing chart showing the timing of the zone bit scan of the flash memory according to the embodiment.

According to the above-described embodiment, the flash memory comprises the zone address latch circuit 20 that holds the address of a zone that is a no fail zone, and the comparison circuit 21 that compares the zone address held by the zone address latch circuit 20 with the currently selected zone address. If the comparison result of the comparison circuit 21 represents that the zone addresses match, the scan control circuit 14 skips the scan of the selected zone. That is, the address of a no fail zone is held in a kth write, and the scan of the zone is skipped from a (k+1)th write. The scan of a zone (no fail zone) without any fail is thus skipped, as shown in FIG. 11. This makes it possible to omit extra scan of no fail zones and shorten the time.

As the write count increases, the number of no fail zones to be skipped increases. For this reason, the total write time can largely shorten. Hence, according to the embodiment, executing the above-described zone bit scan enables to increase the allowable the number of fail bits and speed up the write operation.

[Zone Concept]

In this embodiment, an example has been described in which a page is divided into eight zones, as shown in FIG. 5. However, the embodiment is not limited to this, and the number of zones is variable. The zone concept of the embodiment will be described below with reference to FIG. 12.

Figure 12:
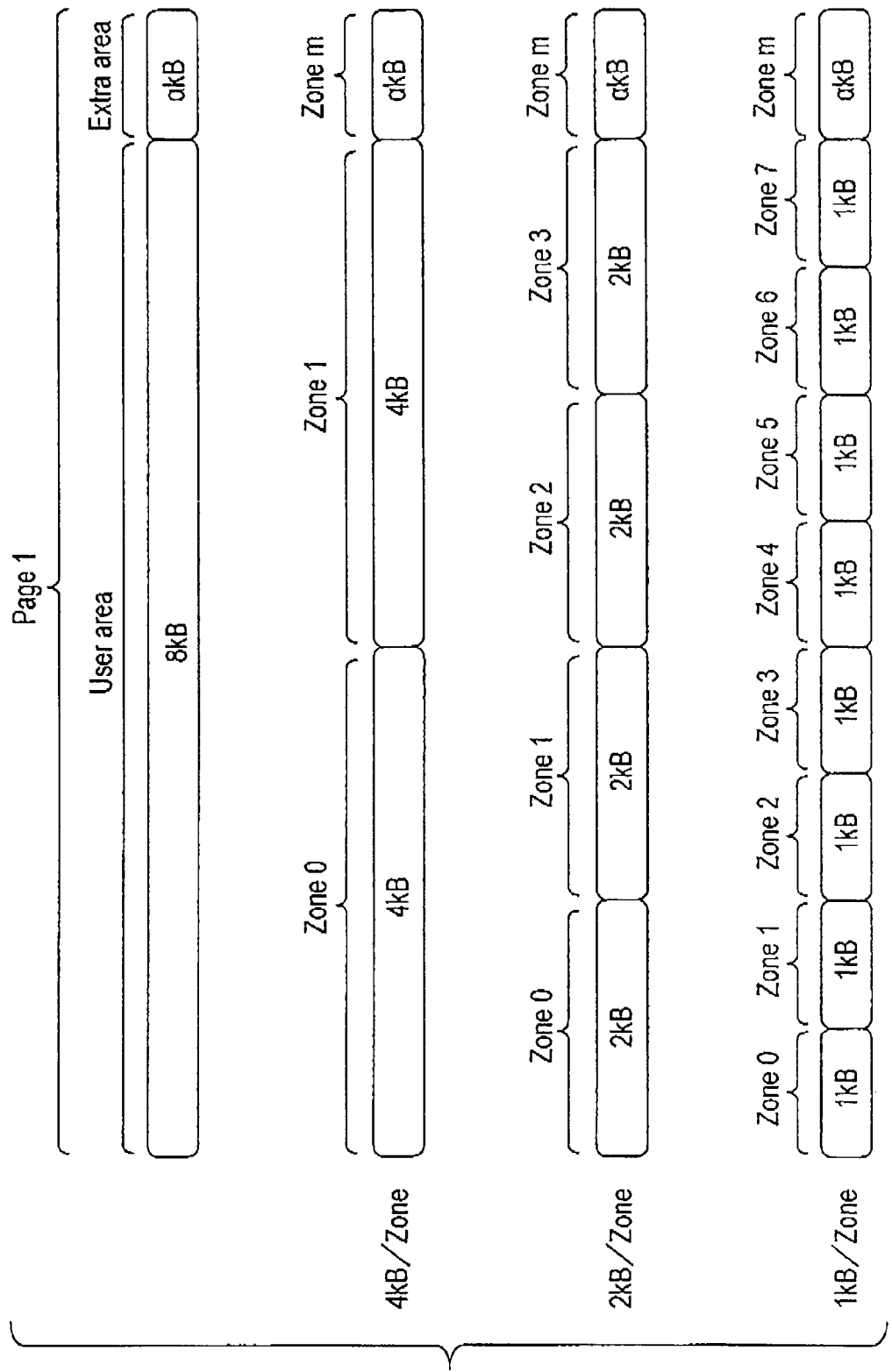
FIG. 12 is a view showing a variable zone structure of the flash memory according to the embodiment.

FIG. 12 shows a variable zone structure according to the embodiment. As shown in FIG. 12, one page includes a user area and an extra area.

The user area is an area where the user writes data. An 8-KB user area is illustrated here as an example. However, the embodiment is not limited to this, and the area size may be 16 KB, 32 KB, 64 KB, or the like.

Management data and the like are stored in the extra area. The extra area includes, for example, an ECC area (not shown) set by an ECC, a redundancy area (not shown) set by the number of redundancies, and the like. The user area and the extra area are included in the same cell array. The ECC area of the extra area is recognized by the user, whereas the redundancy area of the extra area is not recognized by the user. An α-KB extra area is illustrated here as an example. That is, one page is represented by 8+α KB.

The number of zones is set in accordance with the capacity (width) of each zone. When each zone has a capacity of 4 KB, as shown in FIG. 12, the user area has two zones (zones 0 and 1). Together with the m zones of the extra area, one page has 2+m zones. When the capacity of each zone is 2 KB, the user area has four zones (zones 0 to 3). Together with the m zones of the extra area, one page has 4+m zones. When the capacity of each zone is 1 KB, the user area has eight zones (zones 0 to 7). Together with the m zones of the extra area, one page has 8+m zones. That is, the number of zones of the user area and the extra area is represented by $2^n$+m, where n is a natural number and m is zero or a natural number such that $2^n \geq m$.

The number, m, of zones of the extra area is determined based on α and the unit zone capacity (zone width) and α. The number, $2^n$, of zones of the user area is determined based on the unit zone capacity, that is, the number of allowable bits necessary for the entire chip, as will be described later.

Note that the unit zone capacity can be changed in accordance with the page size. The number of zones of the user area preferably remains unchanged even when the page size changes. However, the embodiment is not limited to this, and the number of zones can change as needed based on the product or user specifications. At this time, the device can operate while changing the number of zones in accordance with a parameter such as the preset number of zones. This parameter is set, for example, in accordance with the specifications after the product test and written in the ROM area of the memory cell array inaccessible by the user.

Changing the number of zones (especially the number of zones of the user area) allows the following effects to be obtained. As described above, the number of zones is larger with the zone capacity of 4 KB than with the zone capacity of 1 KB. In zone bit scan, the number of allowable bits is set, and fail bits are counted in each unit zone. For this reason, when the number of zones is large, the number of allowable bits increases for the entire chip. That is, when the number of fail bits is assumed to be large depending on the product or user specifications, the number of zones is increased to increase the number of allowable bits.

Conversely, when the number of zones is increased to increase the number of allowable bits, the zone bit scan time can hardly shorten. Hence, when the number of fail bits is assumed to be small, the number of zones is made as small as possible, thereby shortening the zone bit scan time. The number of allowable bits necessary for the entire chip is thus calculated from the number of fail bits assumed in the product, thereby setting the number of zones. This makes it possible to increase the number of allowable bits while minimizing the increase in the zone bit scan time.

[Modification]

Figure 13:
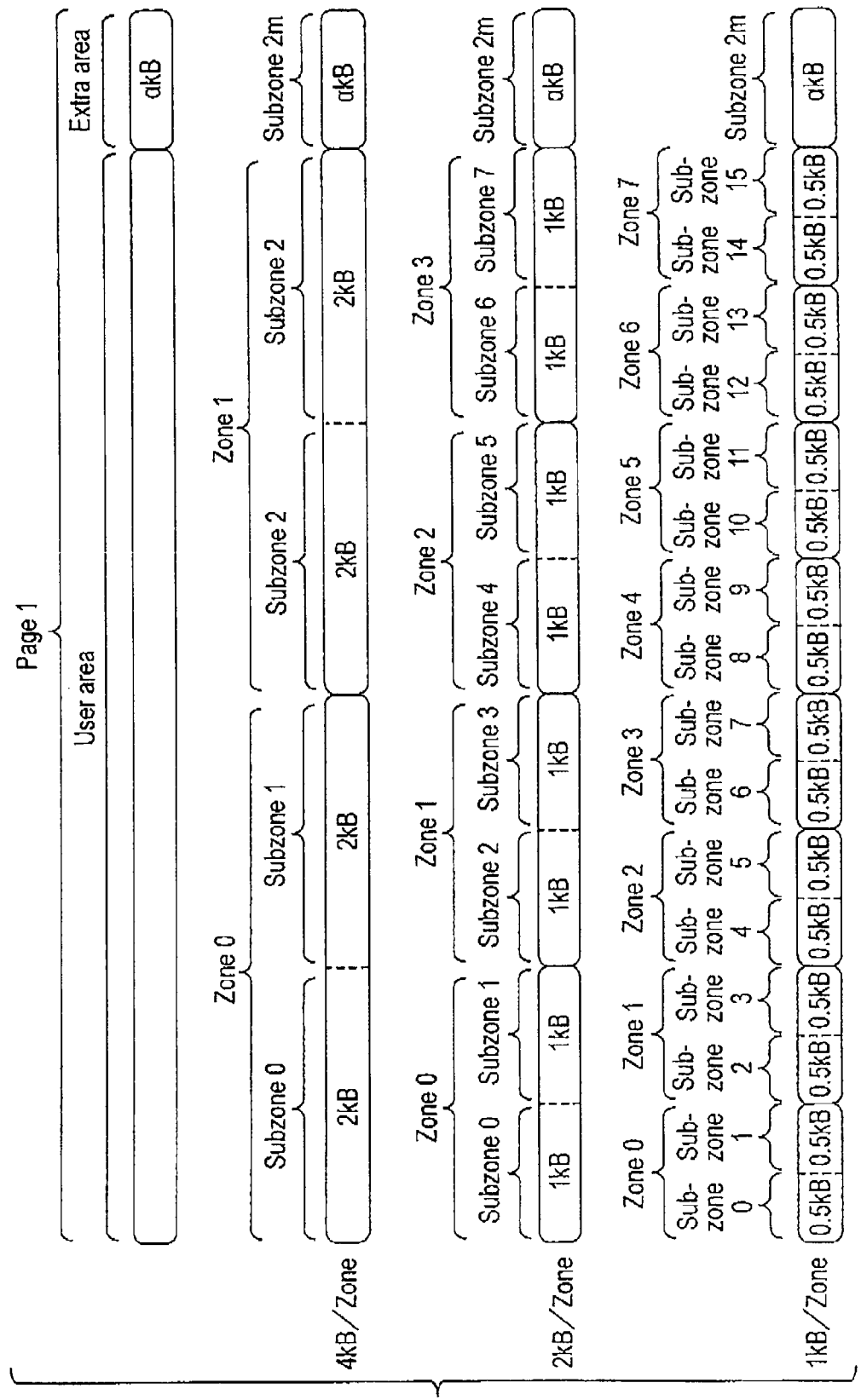
FIG. 13 is a view showing a modification of the variable zone structure of the flash memory according to the embodiment.

FIG. 13 shows a modification of the variable zone structure according to the embodiment. Note that in this modification, a description of the same points as in the above embodiment will be omitted, and only different points will be described.

As shown in FIG. 13, according to the modification, each zone is divided into two subzones. Note that FIG. 13 illustrates an 8-KB user area as an example, like FIG. 12.

More specifically, when each zone has a capacity of 4 KB, the user area has two zones. Each of the two zones is divided into two parts so that the user area has four subzones (subzones 0 to 3). Each subzone has a capacity of 2 KB. The extra area has 2 m subzones. That is, one page has 2×(2+) subzones.

When each zone has a capacity of 2 KB, the user area has four zones. Each of the four zones is divided into two parts so that the user area has eight subzones (subzones 0 to 7). Each subzone has a capacity of 1 KB. The extra area has 2 m subzones. That is, one page has 2×(4+m) subzones.

When each zone has a capacity of 1 KB, the user area has eight zones. Each of the eight zones is divided into two parts so that the user area has 16 subzones (subzones 0 to 15). Each subzone has a capacity of 0.5 KB. The extra area has 2 m subzones. That is, one page has 2×(8+m) subzones.

That is, the number of subzones of the user area and the extra area is represented by $2^{n+1}$+2 m, where n is a natural number and m is zero or a natural number such that $2^n \geq m$.

The circuit arrangement of the flash memory that executes zone bit scan according to the modification is the same as that of the embodiment shown in FIG. 9 except the following points regarding the constituent elements.

The scan control circuit 14 executes the scan operation. More specifically, the scan control circuit 14 counts the fail bits accumulated in the fail count circuit 13 in accordance with the fail flag transferred from the arithmetic circuit 11, and determines whether the number of fail bits is less than or equal to the number of allowable bits (whether fail or pass).

At this time, the scan is executed so as to count and add the number of fail bits in the first subzone (for example, subzone 1, 1 being zero or a natural number) out of the plurality of subzones and those in the second subzone (for example, subzone 1-1) and determine whether the sum of the number of fail bits of the two subzones is less than or equal to the number of allowable bits.

When the scan operation has ended, the scan control circuit 14 outputs the zone increment signal. In addition, if the fail flag of the selected subzone transferred from the arithmetic circuit 11 at the start of scan is "0", the scan control circuit 14 determines that the selected subzone is a no fail subzone, and outputs a latch enable signal to the zone address latch circuit 20.

The zone address control circuit 15 divides one page into a plurality of zones and further divides each zone into two parts so as to divide one page into a plurality of subzones, and sequentially selects a subzone to be scanned. More specifically, the zone address control circuit 15 selects the initial subzone at the start of scan, or selects the subzone to be scanned next upon receiving a subzone increment signal from the scan control circuit 14.

The zone address latch circuit 20 receives the latch enable signal from the scan control circuit 14, and holds the address of the selected subzone that is the no fail subzone. The held zone address is used in the subsequent scan. The zone address latch circuit 20 comprises (number of subzones—1) latches. This is because the scan is executed when at least one subzone with the number of fail bits larger than the number of allowable bits exists, and the zone address latch circuit 20 can hold (number of subzones—1) addresses at maximum.

The comparison circuit 21 compares the subzone address held by the zone address latch circuit 20 with the currently selected subzone address transferred from the zone address control circuit 15. The subzone address held by the zone address latch circuit 20 is the address of the no fail subzone held in the preceding scan. If the addresses match, the zone address latch circuit 20 outputs a matching signal to the scan control circuit 14. Upon receiving the matching signal, the scan control circuit 14 determines that the currently selected zone is a no fail subzone. The scan control circuit 14 then outputs the zone address increment signal to the zone address control circuit to skip the scan of the selected subzone. Conversely, if the subzone address held by the zone address latch circuit 20 does not match the currently selected subzone address transferred from the zone address control circuit 15, the scan control circuit 14 executes scan of the selected subzone.

FIG. 14 is a flowchart illustrating a modification of zone bit scan according to the embodiment.

As shown in FIG. 14, in step S22, the subzone 1 to be scanned is selected first.

In step S23, it is determined whether the selected subzone is a no fail subzone. More specifically, the subzone address held by the zone address latch circuit 20 is compared with the currently selected zone address to determine whether they match. The subzone address held by the zone address latch circuit 20 is the subzone address determined to be of a no fail subzone in the scan of the preceding write operation.

If the selected subzone is a no fail subzone in step S23, it is determined in step S28 whether the selected subzone is the last subzone.

Conversely, if the selected subzone is not a no fail subzone in step S23, the flags serving as fail information are set in step S24. In step S25, it is determined whether the fail flag of the selected subzone is "1" (a fail exists in the selected subzone).

If the fail flag is not "1" (the fail flag is "0") in step S25, the selected subzone is registered as a no fail subzone in step S29. More specifically, the zone address latch circuit 20 holds the address of the selected subzone that is a no fail subzone. After that, it is determined in step S28 whether the selected subzone is the last zone.

Conversely, if the fail flag is "1" in step S25, fail bits in the selected subzone are counted in step S26, and it is determined in step S27 whether the number of fail bits is less than or equal to the number of allowable bits. At this time, the number of fail bits of the currently selected subzone 1 and that of the previously selected subzone 1-1 are added. It is then determined whether the sum of the number of fail bits of the two subzones is less than or equal to the number of allowable bits of the unit zone. That is, counting the number of fail bits is done in each subzone, and comparison with the number of allowable bits is done in each zone.

If the sum of the number of fail bits of the subzone 1 and that of the subzone 1-1 is greater than the number of allowable bits of the unit zone (if the number of fail bits exceeds the number of allowable bits) in step S27, the scan operation ends.

Conversely, if the sum of the number of fail bits of the subzone 1 and that of the subzone 1-1 is less than or equal to the number of allowable bits in step S27, it is determined in step S28 whether the selected subzone is the last subzone.

If the selected subzone is not the last subzone in step S28, the zone increment signal is output in step S30 to select the next subzone (subzone 1+1) to be scanned. After that, it is determined in step S23 whether the selected subzone is a no fail subzone.

Conversely, if the selected subzone is the last subzone in step S28, the scan operation ends.

Note that the fail bits need not always be counted by dividing each zone into two subzones, as in the above-described modification. The number of fail bits may be counted by dividing each zone into three or more subzones for every several columns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array including memory cells;
a write control circuit configured to execute write and verify for each page of the memory cell array;
a latch circuit configured to hold data of a result of the verify;
an address control circuit configured to divide the page into zones and sequentially select an address of each of the zones;
a scan control circuit configured to execute scan so as to count, in accordance with the data held by the latch circuit, the number of fail bits in zone selected by the address control circuit and determine whether the number of fail bits is not more than the number of allowable bits; and
an address latch circuit configured to hold an address of a no fail zone in which the number of the fail bits is 0.

2. The device of claim 1, further comprising a comparison circuit configured to compare the address of the zone selected by the address control circuit with the address of the no fail zone held by the address latch circuit.

3. The device of claim 2, wherein if a result of the comparison by the comparison circuit represents that the address of the zone does not match the address of the no fail zone, the scan control circuit executes the scan of the zone, and if the address of the zone matches the address of the no fail zone, the scan control circuit skips the scan of the zone.

4. The device of claim 3, wherein
the write, the verify, and the scan are repetitively executed, and
the address of the no fail zone held by the address latch circuit in (k+1)th scan is the address of the no fail zone held by the address latch circuit before kth scan.

5. The device of claim 1, further comprising an arithmetic circuit configured to transfer a fail flag concerning fail information of the zone to the scan control circuit,
wherein the scan control circuit executes the scan in accordance with the fail flag.

6. The device of claim 5, wherein the scan control circuit does not execute the scan of the zone if the fail flag is "0", and executes the scan if the fail flag is "1".

7. The device of claim 6, wherein if the fail flag is "0", the scan control circuit causes the address latch circuit to hold the address of the zone as the address of the no fail zone.

8. The device of claim 6, wherein
each zone includes columns, and
the fail flag of each zone is obtained by ORing flags concerning fail information in the columns.

9. The device of claim 1, wherein the page includes a user area and an extra area, and the zones include $2^n$ zones of the user area and m zones of the extra area, where n and m are integers not less than zero such that $n \geq m$.

10. The device of claim 9, wherein the value n is set in accordance with the number of allowable bits necessary for an entire chip, and the value m is set in accordance with an ECC and/or the number of redundancies.

11. The device of claim 1, wherein the address latch circuit includes (the number of zones−1) latches.

12. The device of claim 1, wherein the memory cell array includes NAND cells each including a predetermined number of memory cells, out of the memory cells, having current paths connected in series in a bit-line direction, a first selection transistor connected to one end of the predetermined number of memory cells, and a second selection transistor connected to the other end of the predetermined number of memory cells.

13. A nonvolatile semiconductor memory device comprising:
- a memory cell array including memory cells;
- a write control circuit configured to execute write and verify for each page of the memory cell array;
- a latch circuit configured to hold data of a result of the verify;
- an address control circuit configured to divide the page into zones and further divide each of the zones into two parts so as to divide the page into subzones, and sequentially select an address of each of the subzones;
- a scan control circuit configured to execute scan so as to count, in accordance with the data held by the latch circuit, the number of fail bits in first subzone selected by the address control circuit, add the number of fail bits of the first subzone and that of a second subzone preselected by the address control circuit, and determine whether the sum of the number of fail bits is not more than the number of allowable bits; and
- an address latch circuit configured to hold an address of a no fail subzone in which the number of fail bits is 0.

14. The device of claim 13, further comprising a comparison circuit configured to compare the address of the first subzone selected by the address control circuit with the address of the no fail subzone held by the address latch circuit.

15. The device of claim 14, wherein if a result of the comparison by the comparison circuit represents that the address of the first subzone does not match the address of the no fail subzone, the scan control circuit executes the scan of the first subzone, and if the address of the first subzone matches the address of the no fail subzone, the scan control circuit skips the scan of the first subzone.

16. The device of claim 15, wherein
the write, the verify, and the scan are repetitively executed, and
the address of the no fail subzone held by the address latch circuit in (k+1)th scan is the address of the no fail subzone held by the address latch circuit before kth scan.

17. The device of claim 13, further comprising an arithmetic circuit configured to transfer a fail flag concerning fail information of the first subzone to the scan control circuit,
wherein the scan control circuit executes the scan in accordance with the fail flag.

18. The device of claim 17, wherein the scan control circuit does not execute the scan of the first subzone if the fail flag is "0", and executes the scan if the fail flag is "1".

19. The device of claim 18, wherein if the fail flag is "0", the scan control circuit causes the address latch circuit to hold the address of the first subzone as the address of the no fail subzone.

20. The device of claim 13, wherein the memory cell array includes a plurality of NAND cells each including a predetermined number of memory cells, out of the plurality of memory cells, having current paths connected in series in a bit-line direction, a first selection transistor connected to one end of the predetermined number of memory cells, and a second selection transistor connected to the other end of the predetermined number of memory cells.

* * * * *